(12) United States Patent
Lin

(10) Patent No.: US 11,342,883 B1
(45) Date of Patent: May 24, 2022

(54) VOLTAGE-CONTROLLED OSCILLATOR OF PROGRAMMABLE GAIN

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/316,759

(22) Filed: May 11, 2021

(51) Int. Cl.
H03B 5/12 (2006.01)

(52) U.S. Cl.
CPC ........... *H03B 5/124* (2013.01); *H03B 5/1212* (2013.01); *H03B 5/1228* (2013.01); *H03B 2200/004* (2013.01)

(58) Field of Classification Search
CPC ...................................................... H03B 5/124
USPC ...................................................... 331/177 V
See application file for complete search history.

(56) References Cited

U.S. PATENT DOCUMENTS

| 10,833,685 | B1 * | 11/2020 | Chakraborty | ........ | H03B 5/1296 |
| 2008/0272851 | A1 * | 11/2008 | Lin | ....................... | H03B 5/1228 |
| | | | | | 331/177 R |

* cited by examiner

*Primary Examiner* — Joseph Chang
(74) *Attorney, Agent, or Firm* — McClure, Qualey & Rodack, LLP

(57) ABSTRACT

A programmable variable capacitor includes a fixed varactor controlled by a control voltage connected in a first polarity and a plurality of contingent varactors conditionally controlled by the control voltage in accordance with a plurality of logical signals, respectively, each of said plurality of contingent varactors having: a first varactor controlled by a first voltage connected in the first polarity, a second varactor controlled by a second voltage connected in a second polarity, a first multiplexer configured to output the first voltage by selecting between a first DC (direct-current) voltage and the control voltage in accordance with a respective logical signal among said plurality of logical signals, and a second multiplexer configured to output the second voltage by selecting between a second DC voltage and a medium DC voltage in accordance with the respective logical signal.

14 Claims, 3 Drawing Sheets

VOLTAGE-CONTROLLED OSCILLATOR OF PROGRAMMABLE GAIN

BACKGROUND OF THE DISCLOSURE

Field of the Disclosure

This present invention generally relates to voltage-controlled oscillator and particularly to voltage-controlled oscillator having a high programmable gain.

Description of Related Art

As is known, a VCO (voltage-controlled oscillator) outputs an oscillatory signal of an oscillation frequency controlled by a control voltage. In the present disclosure, hereafter, "frequency of oscillation" and "oscillation frequency" are the same and interchangeable in a context of VCO. In an embodiment, the oscillation frequency is higher (lower) when the control voltage is higher (lower). A gain of a VCO is defined by a ratio between an incremental change of the oscillation frequency and an incremental change of the control voltage; a VCO of a high gain is more responsive to a change of its control voltage.

As depicted in a schematic shown in FIG. 1, a conventional VCO 100 comprises: a tunable resonant tank 110 configured to determine a frequency of an oscillation in accordance with a control voltage $V_C$; and a regenerative network 120 comprising two NMOS (n-channel metal oxide semiconductor) transistors 121 and 122 configured in a cross-coupling topology to establish a negative resistance to provide energy to sustain the oscillation. The tunable resonant tank 110 comprises an inductor 111, a fixed capacitor 112, and a variable capacitor comprising two varactors 113 and 114 controlled by $V_C$. A center-tap of the inductor 111 connected to a power supply node denoted by "$V_{SP}$." VCO 100 is well known in the prior art and thus not described in detail here.

A resonant frequency $f_0$ of the tunable resonant tank 110 is approximated by the equation:

$$f_0 = \frac{1}{2\pi\sqrt{LC_{tot}}} \quad (1)$$

Here, L is an inductance of inductor 111, and $C_{tot}$ is a total capacitance determined by capacitor 112 and the two varactors 113 and 114. An oscillation frequency of VCO 100 is approximately equal to $f_0$, the resonant frequency of the tunable resonant tank 110, if a parasitic capacitance of the regenerative network 120 is substantially smaller $C_{tot}$.

In this present disclosure, a varactor is a two-terminal circuit element of a variable capacitance that comprises a positive terminal marked by "+" and a negative terminal marked by "−"; a capacitance of the varactor increases (decreases) when a voltage at the positive terminal rises (falls) and decreases (increases) when a voltage at the negative terminal rises (falls); when the positive terminal is connected to a control voltage configured to control the variable capacitance, the varactor is said to be forward connected; when the negative terminal is connected to a control voltage configured to control the variable capacitance, the varactor is said to be backward connected. Having said that, the two varactors 113 and 114 in FIG. 1 are clearly backward connected; when $V_C$ rises (falls), a capacitance of the two varactors 113 and 114 decrease (increases), the total capacitance $C_{tot}$ decreases (increases), and consequently the oscillation frequency of VCO 100 increases (decreases). A gain of the VCO 100, denoted by $K_{VCO}$, is defined by an incremental change of the oscillation frequency in response to an incremental change of $V_C$, and can be expressed by the following equation:

$$K_{VCO} \equiv \frac{df_0}{dV_C} \quad (2)$$

In practice, VCO 100 is usually incorporated in a phase lock loop that adjusts the control voltage $V_C$ in a closed-loop manner; in this case, $K_{VCO}$ plays an important role in the dynamics of the phase lock loop. In many cases, it is desirable to have a programmable gain for the VCO. A larger $K_{VCO}$ can lead to a faster response of the phase lock loop, but inevitably make the VCO 100 more sensitive to a circuit noise, because the circuit noise can lead to a larger error in the oscillation frequency when the VCO gain is higher.

What is desired is a VCO of a programmable gain yet can reduce a sensitivity to a circuit noise when the VCO is programmed to have a high gain.

SUMMARY OF THE DISCLOSURE

In an embodiment, a programmable variable capacitor comprises a fixed varactor controlled by a control voltage connected in a first polarity and a plurality of contingent varactors conditionally controlled by the control voltage in accordance with a plurality of logical signals, respectively, each of said plurality of contingent varactors comprising a first varactor controlled by a first voltage connected in the first polarity, a second varactor controlled by a second voltage connected in a second polarity, a first multiplexer configured to output the first voltage by selecting between a first DC voltage and the control voltage in accordance with a respective logical signal among said plurality of logical signals, and a second multiplexer configured to output the second voltage by selecting between a second DC voltage and a medium DC voltage in accordance with the respective logical signal.

In an embodiment, a VCO (voltage-controlled oscillator) comprises a resonant tank comprising a parallel connection of an inductor, a capacitor, and a programmable variable capacitor configured to determine a frequency of an oscillatory signal at a common node in accordance with a control voltage and a plurality of logical signals, and a regenerative network configured to provide a negative resistance at the common node to sustain the oscillation, wherein the programmable variable capacitor comprises a fixed varactor controlled by the control voltage connected in a first polarity and a plurality of contingent varactors conditionally controlled by the control voltage in accordance with a plurality of logical signals, respectively, each of said plurality of contingent varactors comprising a first varactor controlled by a first voltage connected in the first polarity, a second varactor controlled by a second voltage connected in a second polarity, a first multiplexer configured to output the first voltage by selecting between a first DC voltage and the control voltage in accordance with a respective logical signal among said plurality of logical signals, and a second multiplexer configured to output the second voltage by selecting between a second DC voltage and a medium DC voltage in accordance with the respective logical signal.

DETAILED DESCRIPTION OF THIS DISCLOSURE

Figure 1:
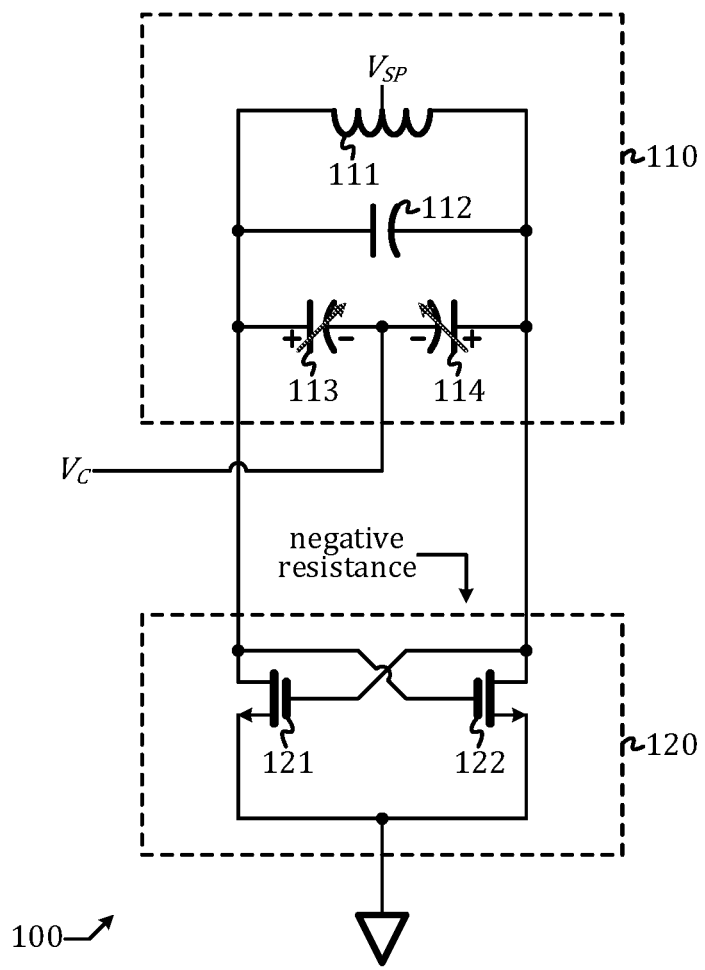
FIG. 1 shows a schematic diagram of a prior art voltage-controlled oscillator.

The present disclosure is directed to voltage-controlled oscillators. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "DC (direct current) voltage," "signal," "parallel connection," "circuit node," "ground," "power supply node," "MOS (metal oxide semiconductor) transistor," "CMOS (complementary metal oxide semiconductor) process technology," "NMOS (n-channel metal oxide semiconductor) transistor," "PMOS (p-channel metal oxide semiconductor) transistor," "varactor," "capacitance," and "multiplexer." Terms and basic concepts like these, when used in a context of microelectronics, are apparent to those of ordinary skill in the art and thus will not be explained in detail here.

Those of ordinary skill in the art understand units such as nH (nano-Henry), pF (pico-Farad), fF (femto-Farad), nm (nano-meter), and μm (micron) without a need of explanations.

Those of ordinary skill in the art can read schematics of a circuit comprising components such as capacitors, NMOS transistors, PMOS transistors, and so on, and do not need a verbose description about how one component connects with another in the schematics. Those of ordinary skill in the art can also recognize a ground symbol, a capacitor symbol, an inductor symbol, a varactor (variable capacitor) symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to as "gate," and "drain terminal" is simply referred to as "drain."

A circuit is a collection of a transistor, a capacitor, a resistor, and/or other electronic devices inter-connected in a certain manner to embody a certain function.

In this disclosure, a "circuit node" is frequently simply stated as a "node" for short, when what it means is clear from a context.

A signal is a voltage of a variable level that carries a certain information and can vary with time. A level of the signal at a moment represents a state of the signal at that moment.

A logical signal is a voltage signal of two states: a low state and a high state. The low state is also known as a "0" state, while the high stage is also known as a "1" state.

Regarding a logical signal Q, "Q is high" or "Q is low," means that "Q is in the high state" or "Q is in the low state." Likewise, "Q is 1" or "Q is 0," means that "Q is in the 1 state" or "Q is in the 0 state."

As mentioned earlier in this present disclosure, a varactor is a two-terminal circuit element of a variable capacitance that comprises a positive terminal marked by "+" and a negative terminal marked by "−"; a capacitance of the varactor increases (decreases) when a voltage at the positive terminal rises (falls) and decreases (increases) when a voltage at the negative terminal rises (falls); when the positive terminal is connected to a control voltage configured to control the variable capacitance, the varactor is said to be forward connected; when the negative terminal is connected to a control voltage configured to control the variable capacitance, the varactor is said to be backward connected. Furthermore, in this present disclosure, a control voltage applied at a positive terminal of a forward connected varactor is referred to as a "forward voltage"; and a control voltage applied at a negative terminal of a backward connected varactor is referred to as a "backward voltage." In a circuit that comprises both a forward connected varactor and a backward connected varactor, one of the forward connected varactor and the backward connected varactor is said to be connected in a first polarity, while the other is said to be connected in a second polarity.

A DC (direct current) voltage is a voltage of a substantially stationary level.

Figure 2:
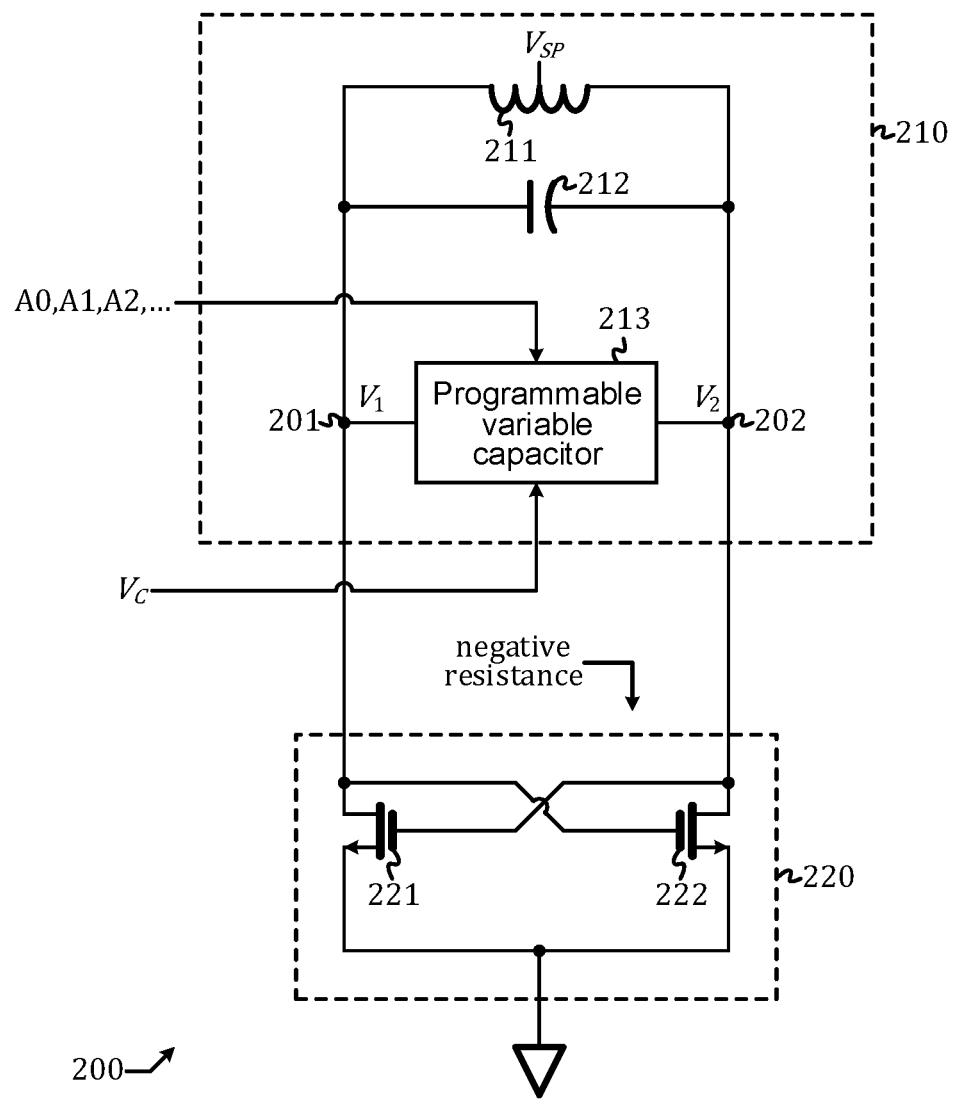
FIG. 2 shows a schematic diagram of a voltage-controlled oscillator in accordance with an embodiment of the present disclosure.

As shown by a schematic depicted in FIG. 2, a VCO 200 in accordance with an embodiment of the present disclosure comprises: a tunable tank 210 comprising an inductor 211, a capacitor 212, and a programmable variable capacitor 213 configured in a parallel connection topology across a first node 201 and a second node 202 to determine a resonant frequency in accordance with a control by a control voltage $V_C$ and a plurality of logical signals A0, A1, A2, and so on; and a regenerative network 220 comprising two NMOS transistors 221 and 222 configured in a cross-coupling topology to provide a negative resistance across the first node 201 and the second node 202 to sustain an oscillation of a first voltage signal $V_1$ at node 201 and a second voltage signal $V_2$ at node 202. A center-tap of the inductor 211 connects to a power supply node denoted by "$V_{SP}$." NMOS transistors 221 and 222 are said to be cross-coupling because a drain of NMOS transistor 221 connects to a gate of NMOS transistor 222, while a drain of NMOS transistor 222 connects to a gate of NMOS transistor 221; that these two MOS transistors configured in a cross-coupling topology can provide a negative resistance to sustain an oscillation is clear to those of ordinary skill in the art and thus not described in detail here. VCO 200 is the same as VCO 100 of FIG. 1 except that the two varactors 113 and 114 in VCO 100 are replaced by the programmable variable capacitor 213 in VCO 200. Equation (1) can be applied to calculate the resonant frequency of the tunable tank 210, where L is an inductance of inductor 211, and $C_{tot}$ is a total capacitance determined by capacitor 212 and the programmable variable capacitor 213. In an embodiment, a parasitic capacitance of the regenerative network 220 is substantially smaller than $C_{tot}$, thus equation (1) can be used to calculate an oscillation frequency of VCO 200.

Figure 3:
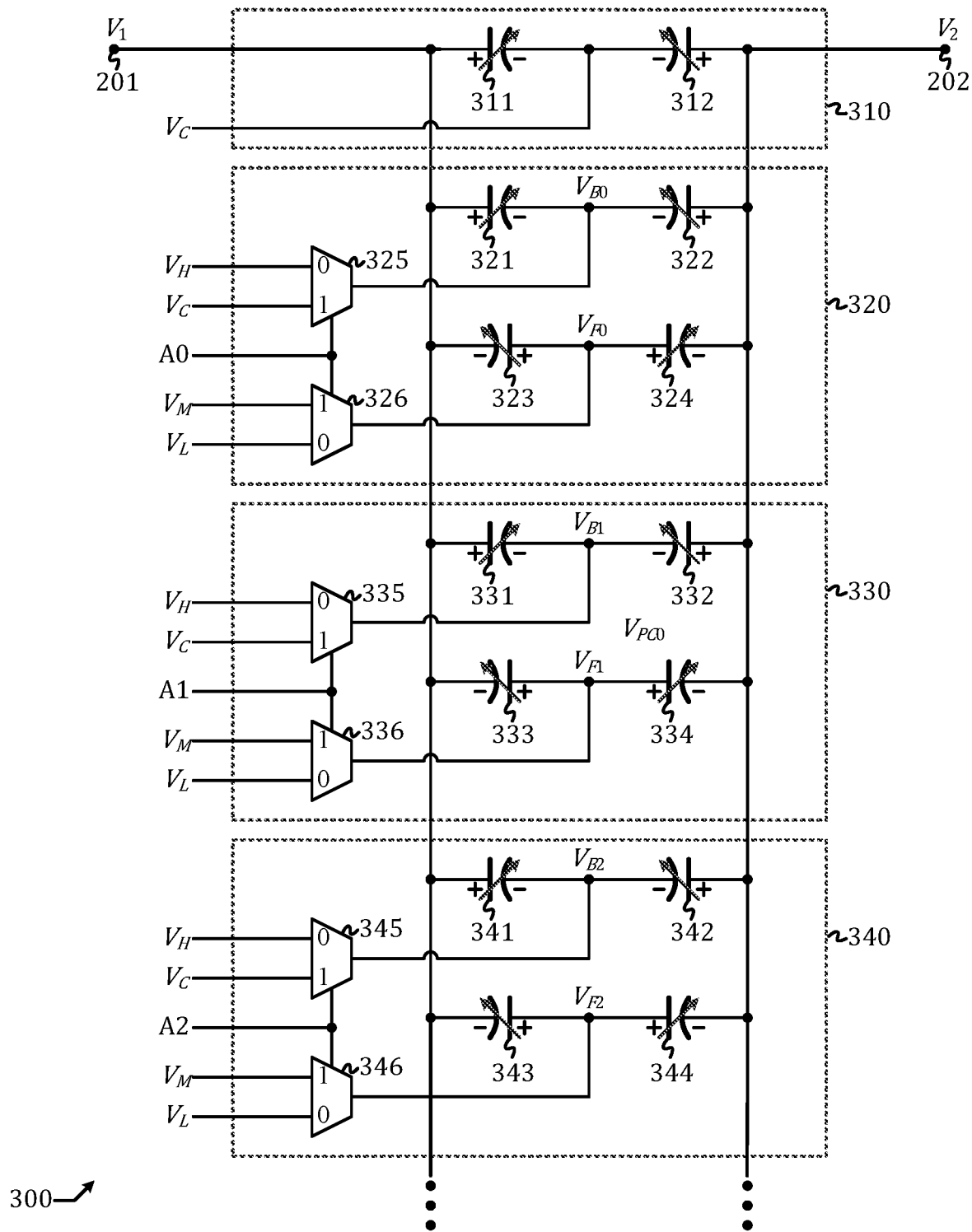
FIG. 3 shows a schematic diagram of a programmable variable capacitor in accordance with an embodiment of the present disclosure.

A schematic diagram of a programmable variable capacitor 300 that can be used to embody programmable variable capacitor 213 of VCO 200 in accordance with an embodiment of the present disclosure is shown in FIG. 3. Programmable variable capacitor 300 is configured to provide a variable capacitance between the two nodes 201 and 202 in accordance with said plurality of logical signals A0, A1, A2, and so on, and the control voltage $V_C$ along with three DC voltages including a low DC voltage $V_L$, a high DC voltage $V_H$ that is higher than the low DC voltage $V_L$, and a medium DC voltage $V_M$ that is between the low DC voltage $V_L$ and the high DC voltage $V_H$. Programmable variable capacitor 300 comprises: a parallel connection of a fixed varactor 310 and a plurality of contingent varactors 320, 330, 340, and so on, with a contingency determined by said plurality of logical signals A0, A1, A2, and so on, respectively. Fixed varactor 310 comprise two backward connected varactors 311 and 312 of a capacitance controlled by the control voltage $V_C$. Each contingent varactor comprises: two backward connected varactors controlled by a backward voltage; two forward connected varactors controlled by a forward voltage; and two multiplexers including a first multiplexer configured to output the backward voltage by selecting between the high DC voltage $V_H$ and the control voltage $V_C$ in accordance with a respective logical signal among said plurality of logical signals A0, A1, A2, and so on, and a second multiplexer configured to output the forward voltage by selecting between the low DC voltage $V_L$ and the medium DC voltage $V_M$ in accordance with the respective logical signal. More specifically, the contingent varactor 320 (330, 340) comprises: two backward connected varactors 321 (331, 341) and 322 (332, 342) controlled by a backward voltage $V_{B0}$ ($V_{B1}$, $V_{B2}$); two forward connected varactors 323 (333, 343) and 324 (334, 344) controlled by a forward voltage $V_{F0}$ ($V_{F1}$, $V_{F2}$); two multiplexers including a first multiplexer 325 (335, 345) configured to output the backward voltage $V_{B0}$ ($V_{B1}$, $V_{B2}$) by selecting between the high DC voltage $V_H$ and the control voltage $V_C$ in accordance with logical signal A0 (A1, A2) and a second multiplexer 326 (336, 346) configured to output the forward voltage $V_{F0}$ ($V_{F1}$, $V_{F2}$) by selecting between the low DC voltage $V_L$ and the medium DC voltage $V_M$ in accordance with logical signal A0 (A1, A2).

Contingent varactors 320, 330, 340, and so on, have the same function and work in accordance with the same principle. For brevity, only contingent varactor 320 will be described in detail. Whatever descriptions that apply to contingent varactor 320 also apply to contingent varactors 330 and 340, but A0 is replaced by A1 and A2, respectively, $V_{B0}$ is replaced by $V_1$ and $V_{B2}$, respectively, $V_{F0}$ is replaced by $V_{F1}$ and $V_{F2}$, respectively, multiplexer 325 is replaced by multiplexers 335 and 345, respectively, and multiplexer 326 is replaced by multiplexers 336 and 346, respectively.

When A0 is 0, multiplexer 325 selects $V_H$ as $V_{B0}$ and multiplexer 326 selects $V_L$ as $V_{F0}$; in this case, the two backward connected varactors 321 and 322 have a fixed capacitance determined by $V_H$, the two forward connected varactors 323 and 324 have a fixed capacitance determined by $V_L$, and a total capacitance of the contingent varactor 320 is fixed. When A0 is 1, multiplexer 325 selects $V_C$ as $V_{B0}$ and multiplexer 326 selects $V_M$ as $V_{F0}$; in this case, the two backward connected varactors 321 and 322 have a variable capacitance controlled by $V_C$, the two forward connected varactors 323 and 324 have a fixed capacitance determined by $V_M$, and the total capacitance of the contingent varactor 320 is variable and varies in accordance with $V_C$. This way, the total capacitance of the contingent varactor 320 can be programmed to be either fixed or variable. A total capacitance of the programmable variable capacitor 300 is thus variable and varies in accordance with the control voltage $V_C$, and an incremental change of the total capacitance in response to an incremental change of the control voltage $V_C$ depends on states of said logical signals A0, A1, A2, and so on.

In an embodiment, all the contingent varactors 320, 330, 340, and so on are identical; in this case, an incremental change of the total capacitance in response to an incremental change of the control voltage $V_C$ is larger (smaller) if more (fewer) of said logical signals A0, A1, A2, and so on are 1, and consequently an incremental change of the oscillation frequency of VCO 200 is larger (smaller); that is, VCO 200 has a higher (lower) gain. The gain of VCO 200 is thus variable and can be programmed by setting states of said logical signals A0, A1, A2, and so on.

In an embodiment, the two backward connected varactors 321 and 322 and the two forward connected varactors 323 and 324 are all identical; the high DC voltage $V_H$ is approximately equal to a higher bound of $V_1$ and $V_2$; the low DC voltage $V_L$ is approximately equal to a lower bound of $V_1$ and $V_2$; the medium DC voltage $V_M$ is approximately equal to a mean of $V_1$ and $V_2$; and a nominal value of the control voltage $V_C$ is approximately equal to the mean value of $V_1$ and $V_2$, i.e., the control voltage $V_C$ varies around the mean value of $V_1$ and $V_2$. In a typical case of oscillation, $V_1$ and $V_2$ have a higher bound of approximately twice of the supply voltage $V_{SP}$ and a lower bound of approximately 0 V, and a mean value of $V_{SP}$. This way, when A0 is 1, $V_{B0}$ is approximately equal to $V_{F0}$ in a nominal case, and the two backward connected varactors 321 and 322 and the two forward connected varactors 323 and 324 are balanced, so that when an average voltage of $V_1$ at node 201 or an average voltage of $V_2$ at node 202 increases due to a noise, a corresponding increase of the capacitance of the two backward connected varactors 321 and 322 can be compensated by a corresponding decrease of the capacitance of the two forward connected varactors 323 and 324. When A0 is 0, the two backward connected varactors 321 and 322 and the two forward connected varactors 323 and 324 have approximately the same capacitance, and when an average voltage of $V_1$ at node 201 or an average voltage of $V_2$ at node 202 increases due to a noise, a corresponding increase of the capacitance of the two backward connected varactors 321 and 322 can be compensated by a corresponding decrease of the capacitance of the two forward connected varactors 323 and 324. The contingent varactor 320 thus can be highly balanced and immune to noise regardless of a state of A0. Therefore, the programmable variable capacitor 213 can be highly balanced and immune to noise regardless of states of said logical signals A0, A1, A2, and so on.

Multiplexers are well known in the prior and thus not described in detail here. Multiplexers 325, 326, 335, 336, 345, 346 and so on can be embodied using whatever multiplexer circuit known in the prior art at a discretion of circuit designer.

By way of example but not limitation: VCO 200 is fabricated on a silicon substrate using a 55 nm CMOS process technology; $V_{SP}$ is 700 mV; inductor 211 is 250 pH; capacitor 212 is 1.45 pF; NMOS transistors 221 and 222 are identical, each having a W/L (which stands for width/length) of 30 μm/60 nm; the two backward connected varactors 311 and 312 are identical, each having W/L of 24 μm/200 nm and capacitances of 77.8 fF, 63.4 fF, and 36.2 fF when voltage differences between its "+" terminal and "−" terminal are 1.2V, 0V, and −1.2V, respectively; there are four contingent variable capacitors that are identical, and all the varactors in these four contingent variable capacitors are identical, each having W/L of 6 μm/200 nm and capacitances of 19.4 fF, 15.8 fF, and 9.1 fF when voltage differences between its "+"

terminal and "−" terminal are 1.2V, 0V, and −1.2V, respectively; and VCO 200 has a nominal oscillation frequency of approximately 8 GHz and a gain of approximately 60 MHz/V when all logical signals A0, A1, A2, and so on are 1, and 30 MHz/V when all logical signals A0, A1, A2, and so on are 0.

Programmable variable capacitor 300 is an embodiment intended to let VCO 200 have a positive gain, wherein an increase of the control voltage $V_C$ leads to a decrease of a total capacitance of the programmable variable capacitor 300 and thus a higher oscillation frequency. If a negative gain is sought, one can do the following: replace every backward connected varactor with a forward connected varactor and at the same time replace every forward connected varactor with a backward connected varactor; and replace $V_H$ with $V_L$ and at the same time replace $V_L$ with $V_H$. Since this present disclosure can apply to VCO of either a positive gain or a negative gain, "backward connected" and "forward connected" might be swapped, therefore in the appended claims "connected in a first polarity" and "connected in a second polarity" are used, wherein in a positive gain scenario "connected in a first polarity" and "connected in a second polarity" refer to "backward connected" and "forward connected," respectively, while in a negative gain scenario "connected in a first polarity" and "connected in a second polarity" refer to "forward connected" and "backward connected," respectively. Likewise, "a first DC voltage" and "a second DC voltage" are used, wherein in a positive gain scenario, "a first DC voltage" and "a second DC voltage" refer to "a high DC voltage" and "a low DC voltage," respectively, while in a negative gain scenario "a first DC voltage" and "a second DC voltage" refer to "a low DC voltage" and "a high DC voltage," respectively. Similarly, "a first bound" and "a second bound" are used, wherein in a positive gain scenario, "a first bound" and "a second bound" refer to "an upper bound" and "a lower bound," respectively, while in a negative gain scenario "a first bound" and "a second bound" refer to "a lower bound" and "an upper bound," respectively, This present disclosure can be applied to VCO of other topologies, for instance: using PMOS transistors to embody a negative resistance or using both NMOS transistors and PMOS transistors to embody a negative resistance. Therefore, in the appended claims, "MOS transistors" are used.

VCO 200 is of a differential circuit topology, wherein an oscillation signal is a differential signal comprising two voltages $V_1$ and $V_2$ that are substantially balanced and complementary, i.e., a change of $V_1$ of an amount is always accompanied by an opposite change of $V_2$ of approximately the same amount. This is just an example but not limitation. This present disclosure also applies to a VCO of a single-ended circuit topology, for instance, a Colpitts oscillator that comprises a capacitor configured to tune an oscillation frequency, by replacing said capacitor with a half circuit of the programmable variable capacitor 300, wherein half of the varactors are removed (for instance, varactors 312, 322, 324, 332, 334, 342, 344, and so on, are removed).

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A programmable variable capacitor comprises a fixed varactor controlled by a control voltage connected in a first polarity and a plurality of contingent varactors conditionally controlled by the control voltage in accordance with a plurality of logical signals, respectively, each of said plurality of contingent varactors comprising:
a first varactor controlled by a first voltage connected in the first polarity,
a second varactor controlled by a second voltage connected in a second polarity,
a first multiplexer configured to output the first voltage by selecting between a first DC (direct-current) voltage and the control voltage in accordance with a respective logical signal among said plurality of logical signals, and
a second multiplexer configured to output the second voltage by selecting between a second DC voltage and a medium DC voltage in accordance with the respective logical signal.

2. The programmable variable capacitor of claim 1, wherein the fixed varactor and said plurality of contingent varactors are connected in parallel to an oscillatory signal at common node.

3. The programmable variable capacitor of claim 2, wherein the first DC voltage is approximately equal to a first bound of the oscillatory signal, and the second DC voltage is approximately equal to a second bound of the oscillatory signal.

4. The programmable variable capacitor of claim 3, wherein the medium DC voltage is approximately equal to a nominal value of the control voltage.

5. The programmable variable capacitor of claim 3, wherein the medium DC voltage is approximately equal to an average voltage of the oscillatory signal.

6. The programmable variable capacitor of claim 3, wherein: a capacitance of the fixed varactor decreases when the control voltage rises, the first bound of the oscillatory signal is an upper bound of the oscillatory signal, and the second bound of the oscillatory signal is a lower bound of the oscillatory signal.

7. The programmable variable capacitor of claim 3, wherein: a capacitance of the fixed varactor increases when the control voltage rises, the first bound of the oscillatory signal is a lower bound of the oscillatory signal, and the second bound of the oscillatory signal is a higher bound of the oscillatory signal.

8. A voltage-controlled oscillator (VCO) comprising a resonant tank and a regenerative network, the resonant tank comprising a parallel connection of an inductor, a capacitor, and a programmable variable capacitor configured to determine a frequency of an oscillatory signal at a common node in accordance with a control voltage and a plurality of logical signals, and the regenerative network configured to provide a negative resistance at the common node to sustain an oscillation, wherein the programmable variable capacitor comprises a fixed varactor controlled by the control voltage connected in a first polarity and a plurality of contingent varactors conditionally controlled by the control voltage in accordance with a plurality of logical signals, respectively, each of said plurality of contingent varactors comprising:
a first varactor controlled by a first voltage connected in the first polarity,
a second varactor controlled by a second voltage connected in a second polarity,
a first multiplexer configured to output the first voltage by selecting between a first DC (direct-current) voltage and the control voltage in accordance with a respective logical signal among said plurality of logical signals, and a second multiplexer configured to output the second voltage by selecting between a second DC voltage and a medium DC voltage in accordance with the respective logical signal.

9. The VCO of claim 8, wherein the regenerative network comprising two MOS (metal oxide semiconductor) transistors configured in a cross-coupling topology.

10. The VCO of claim 8, wherein the first DC voltage is approximately equal to a first bound of the oscillatory signal, and the second DC voltage is approximately equal to a second bound of the oscillatory signal.

11. The VCO of claim 8, wherein the medium DC voltage is approximately equal to a nominal value of the control voltage.

12. The VCO of claim 8, wherein the medium DC voltage is approximately equal to an average voltage of the oscillatory signal.

13. The VCO of claim 10, wherein: a capacitance of the fixed varactor decreases when the control voltage rises, the first bound of the oscillatory signal is an upper bound of the oscillatory signal, and the second bound of the oscillatory signal is a lower bound of the oscillatory signal.

14. The VCO of claim 10, wherein: a capacitance of the fixed varactor increases when the control voltage rises, the first bound of the oscillatory signal is a lower bound of the oscillatory signal, and the second bound of the oscillatory signal is a higher bound of the oscillatory signal.

* * * * *